US009940992B2

(12) United States Patent
Atallah et al.

(10) Patent No.: US 9,940,992 B2
(45) Date of Patent: Apr. 10, 2018

(54) LEAKAGE-AWARE ACTIVATION CONTROL OF A DELAYED KEEPER CIRCUIT FOR A DYNAMIC READ OPERATION IN A MEMORY BIT CELL

(71) Applicant: QUALCOMM Incorporated, San Diego, CA (US)

(72) Inventors: Francois Ibrahim Atallah, Raleigh, NC (US); Hoan Huu Nguyen, Durham, NC (US); Keith Alan Bowman, Morrisville, NC (US)

(73) Assignee: QUALCOMM Incorporated, San Diego, CA (US)

( * ) Notice: Subject to any disclaimer, the term of this patent is extended or adjusted under 35 U.S.C. 154(b) by 14 days.

(21) Appl. No.: 15/085,187

(22) Filed: Mar. 30, 2016

(65) Prior Publication Data

US 2017/0287550 A1 Oct. 5, 2017

(51) Int. Cl.
| | | |
|---|---|---|
| *G11C 8/08* | (2006.01) | |
| *G11C 11/419* | (2006.01) | |
| *G11C 7/12* | (2006.01) | |
| *G11C 7/22* | (2006.01) | |
| *G11C 8/10* | (2006.01) | |
| *G11C 7/06* | (2006.01) | |

(52) U.S. Cl.
CPC .............. *G11C 11/419* (2013.01); *G11C 7/06* (2013.01); *G11C 7/12* (2013.01); *G11C 7/22* (2013.01); *G11C 8/08* (2013.01); *G11C 8/10* (2013.01)

(58) Field of Classification Search
CPC ...... G11C 7/12–7/22; G11C 8/08–8/10; G11C 7/225; G11C 11/409–11/419; G11C 2207/005
See application file for complete search history.

(56) References Cited

U.S. PATENT DOCUMENTS

| | | |
|---|---|---|
| 7,417,469 B2 | 8/2008 | Cheng et al. |
| 7,474,132 B2 | 1/2009 | Cheng |
| (Continued) | | |

FOREIGN PATENT DOCUMENTS

WO 2015099748 A1 7/2015

OTHER PUBLICATIONS

International Search Report and Written Opinion for PCT/US2017/020351, dated May 15, 2017, 13 pages.

*Primary Examiner* — Hien Nguyen
(74) *Attorney, Agent, or Firm* — W&T/Qualcomm

(57) ABSTRACT

Leakage-aware activation control of a delayed keeper circuit for a dynamic read operation in a memory bit cell is disclosed. In one aspect, a leakage-aware activation control circuit is provided for a dynamic read circuit configured to perform read operations on a memory bit cell. To prevent or mitigate contention between the delayed keeper circuit and a read port circuit in the dynamic read circuit pulling a dynamic node to opposite voltage levels when a read operation is initiated, the leakage-aware activation control circuit is configured to adaptively control activation timing of the delayed keeper circuit based on a comparison of N-type Field-Effect Transistor (NFET) leakage current to P-type FET (PFET) leakage current. In this manner, the leakage-aware activation control circuit can adaptively adjust the activation timing of the delayed keeper circuit based on the actual relative strengths of NFETs and PFETs.

27 Claims, 13 Drawing Sheets

(56) References Cited

U.S. PATENT DOCUMENTS

| | | | |
|---|---|---|---|
| 8,482,316 B1 | 7/2013 | Liu et al. | |
| 8,644,087 B2 | 2/2014 | Lin et al. | |
| 8,988,954 B2 | 3/2015 | Chong et al. | |
| 2004/0189337 A1 | 9/2004 | Hsu et al. | |
| 2006/0049850 A1* | 3/2006 | Chu | H03K 19/0963 326/98 |
| 2006/0262628 A1* | 11/2006 | Nii | G11C 5/063 365/226 |
| 2007/0146013 A1 | 6/2007 | Hsu et al. | |
| 2007/0211517 A1* | 9/2007 | Burnett | G11C 11/419 365/154 |
| 2009/0267649 A1* | 10/2009 | Saint-Laurent | H03K 19/0016 326/95 |
| 2010/0257492 A1* | 10/2010 | Joshi | G01R 31/025 716/100 |
| 2014/0204657 A1* | 7/2014 | Daily | G11C 11/4125 365/154 |
| 2014/0204687 A1* | 7/2014 | Sinangil | G11C 29/52 365/189.11 |
| 2015/0009751 A1* | 1/2015 | Kulkarni | G11C 5/145 365/156 |

\* cited by examiner

| PROCESS (902) | PROG <0> | PROG <1> | PROG <2> | PROG <3> | PROG <4> | PROG <5> | PROG <6> | PROG <7> | PULSE WIDTH (906) |
|---|---|---|---|---|---|---|---|---|---|
| CONVENTIONAL KEEPER CIRCUIT | 1 | 0 | 0 | 0 | 0 | 0 | 0 | 0 | NO PULSE |
| FAST N   SLOW P | 0 | 1 | 0 | 0 | 0 | 0 | 0 | 0 | SMALLEST |
| FAST N   SLOW ≥ P > TYP. | 0 | 0 | 1 | 0 | 0 | 0 | 0 | 0 | 2ND TO SMALLEST |
| FAST N   TYP. ≥ P > FAST | 0 | 0 | 0 | 1 | 0 | 0 | 0 | 0 | 3RD TO SMALLEST |
| FAST N   FAST P | 0 | 0 | 0 | 0 | 1 | 0 | 0 | 0 | 4TH TO SMALLEST |
| TYP. ≥ N > FAST   SLOW P | 0 | 0 | 1 | 0 | 0 | 0 | 0 | 0 | 2ND TO SMALLEST |
| TYP. ≥ N > FAST   SLOW ≥ P > TYP. | 0 | 0 | 0 | 1 | 0 | 0 | 0 | 0 | 3RD TO SMALLEST |
| TYP. ≥ N > FAST   TYP. ≥ P > FAST | 0 | 0 | 0 | 0 | 1 | 0 | 0 | 0 | 4TH TO SMALLEST |
| TYP. ≥ N > FAST   FAST P | 0 | 0 | 0 | 0 | 0 | 1 | 0 | 0 | 5TH TO SMALLEST |
| SLOW ≥ N > TYP.   SLOW P | 0 | 0 | 0 | 1 | 0 | 0 | 0 | 0 | 3RD TO SMALLEST |
| SLOW ≥ N > TYP.   SLOW ≥ P > TYP. | 0 | 0 | 0 | 0 | 1 | 0 | 0 | 0 | 4TH TO SMALLEST |
| SLOW ≥ N > TYP.   TYP. ≥ P > FAST | 0 | 0 | 0 | 0 | 0 | 1 | 0 | 0 | 5TH TO SMALLEST |
| SLOW ≥ N > TYP.   FAST P | 0 | 0 | 0 | 0 | 0 | 0 | 1 | 0 | 6TH TO SMALLEST |
| SLOW N   SLOW P | 0 | 0 | 0 | 0 | 1 | 0 | 0 | 0 | 4TH TO SMALLEST |
| SLOW N   SLOW ≥ P > TYP. | 0 | 0 | 0 | 0 | 0 | 1 | 0 | 0 | 5TH TO SMALLEST |
| SLOW N   TYP. ≥ P > FAST | 0 | 0 | 0 | 0 | 0 | 0 | 1 | 0 | 6TH TO SMALLEST |
| SLOW N   FAST P | 0 | 0 | 0 | 0 | 0 | 0 | 0 | 1 | LARGEST |

*FIG. 9*

PROG<1>=C0 & (~C5)

PROG<2>=[C0 & (C5 & (~C3))] | [(~C0 & C2) & (~C5)]

PROG<3>=[C0 & (C3 & (~C1))] | [(~C0 & C2) & (C5 & (~C3))] | [(~C2 & C4) & (~C5)]

PROG<4>=[C0 & C1] | [(C2 & (~C0)) & (C3 & (~C1))] | [(C4 & (~C2)) & (C5 & (~C3))]

PROG<5>=[C2 & (~C0)] | [(C4 & (~C2)) & (C3 & (~C1))] | [C4 & (C5 & (~C3))]

PROG<6>=[(C4 & (~C2)) & C1] | [(~C4) & ((~C5) & C3)]

PROG<7>=C1 & (~C4)

*FIG. 10*

LEAKAGE-AWARE ACTIVATION CONTROL OF A DELAYED KEEPER CIRCUIT FOR A DYNAMIC READ OPERATION IN A MEMORY BIT CELL

BACKGROUND

I. Field of the Disclosure

The technology of the disclosure relates generally to memory systems employing memory bit cells for storing data, and more particularly to dynamic read circuits for performing dynamic read operations in a memory bit cell.

II. Background

Processor-based systems that include a central processing unit (CPU) or other processors utilize memory of varying types for system operations. This memory may be used as system memory for data storage. This memory may also be used to store program code or instructions to be executed by a CPU or processor.

For example, FIG. 1 illustrates a memory system 100 that can be provided in a processor-based system. The memory system 100 in this particular example employs memory bit cells 102(1)-102(N) for storing data, as shown in FIG. 1. Each memory bit cell 102 is capable of storing a single bit of information. In FIG. 1, a single memory bit cell column 104 is shown that contains a plurality of memory bit cells 102(1)-102(N), wherein 'N' can be any number of rows of memory bit cells desired. However, note that multiple memory bit cell columns 104 may be provided in the memory system 100 to provide a data array of the memory bit cells 102(1)-102(N). In this example, the memory bit cells 102(1)-102(N) are provided in the form of eight (8) transistor (T) (8-T) complement memory bit cells. Using memory bit cell 102(1) as a reference example, each memory bit cell 102(1)-102(N) includes two (2) cross-coupled inverters 106(1), 106(2) (i.e., four (4) transistors) and two (2) access transistors 108(1), 108(2) configured to be activated by a row word line WL(1) for the accessed memory row 1 of the memory bit cell 102(1) for performing write operations, as is well known. Two (2) additional transistors, a pull-down NFET 110(1) and a read port NFET 110(2), are provided for the memory bit cell 102(1) as part of a dynamic read circuit 112 for performing read operations in the memory bit cell 102(1). The dynamic read circuit 112 performs read operations for each of the memory bit cells 102(1)-102(N) for the memory bit cell column 104. The assertion of a particular word line WL(1)-WL(N) for a given respective memory row 1-N controls which memory bit cell 102(1)-102(N) is read by the dynamic read circuit 112 during a read operation. Providing the additional pull-down NFET 110(1) and read port NFET 110(2) in the dynamic read circuit 112 decouples write performance of the memory bit cell 102(1) from read performance of the memory bit cell 102(1).

During a pre-charge phase of the memory bit cell 102(1), a charge P-type Field-Effect Transistor (PFET) 116 is activated in response to a read clock signal (read_clk) 118 being a low logic level indicating that a read operation is not active. This causes a dynamic node 120 in the dynamic read circuit 112 to be pre-charged to voltage Vdd. Then, during an evaluation phase in response to the read clock signal (read_clk) 118 being a logic high level indicating a read operation, the PFET 116 is turned off and the pull-down NFET 110(1) is activated to be coupled to ground (GND). If the charge on a complement node 122C in the selected memory bit cell 102(1)-102(N) is a logical '1' (i.e., voltage Vdd) during a read operation, the pull-down NFET 110(1) is activated to pull the dynamic node 120 down to ground (GND). Pulling the dynamic node 120 to ground (GND) will cause a logical '1' to generate on a read out node 124 by an inverter 126. However, a keeper circuit 128 is initially activated by the complement node 122C having a logical '1' state during the read operation, which causes the inverter 126 to generate a logical '0' on the read out node 124 and keep the keeper circuit 128 activated thereby pulling the dynamic node 120 up to voltage Vdd in contention with the pull-down NFET 110(1).

SUMMARY OF THE DISCLOSURE

Aspects of the disclosure involve leakage-aware activation control of a delayed keeper circuit for a dynamic read operation in a memory bit cell. In this regard, in one aspect, a leakage-aware activation control circuit is provided for a dynamic read circuit configured to perform read operations on a memory bit cell. The dynamic read circuit includes a delayed keeper circuit configured to keep a read out value from the selected memory bit cell asserted on a dynamic node in the dynamic read circuit during an evaluation phase of a dynamic read operation. To prevent or mitigate contention between the delayed keeper circuit and a read port circuit in the dynamic read circuit pulling the dynamic node to opposite voltage levels when a read operation is initiated, the delayed keeper circuit is selectively deactivated during the evaluation phase. However, because factors such as process variation and technology node scaling can affect leakage current of transistors in the delayed keeper circuit and the read port circuit, and thus their relative transistor strengths, aspects disclosed herein include the leakage-aware activation control circuit for controlling activation timing of the delayed keeper circuit. The leakage-aware activation control circuit is configured to adaptively control the activation timing of the delayed keeper circuit based on a comparison of N-type Field-Effect Transistor (NFET) leakage current to P-type FET (PFET) leakage current. In this manner, if the relative strengths of the NFETs and PFETs in the delayed keeper circuit and read port circuit of the dynamic read circuit vary from design time assumptions, the leakage-aware activation control circuit can adaptively adjust the activation timing of the delayed keeper circuit based on the actual relative strengths of the NFETs and PFETs to avoid or reduce contention with the read port circuit in response to initiation of the evaluation phase of a read operation.

In this regard, in one exemplary aspect, a leakage-aware activation control circuit for controlling activation of a delayed keeper circuit in a dynamic read circuit for a memory bit cell is provided. The leakage-aware activation control circuit comprises an NFET leakage circuit configured to provide an NFET leakage indicator indicating leakage current of at least one NFET in a dynamic read circuit. The leakage-aware activation control circuit also comprises a PFET leakage circuit configured to provide a PFET leakage indicator indicating leakage current of at least one PFET in the dynamic read circuit. The leakage-aware activation control circuit also comprises a comparator circuit. The comparator circuit is configured to receive the NFET leakage indicator and the PFET leakage indicator. The comparator circuit is also configured to compare the NFET leakage indicator to the PFET leakage indicator. The comparator circuit is also configured to generate a FET leakage signal based on the comparison of the NFET leakage indicator to the PFET leakage indicator. The leakage-aware activation control circuit also comprises a control signal generator configured to adaptively generate at least one control signal based on the FET leakage signal to control activation timing of a delayed keeper circuit.

In another exemplary aspect, a leakage-aware activation control circuit for controlling activation of a delayed keeper circuit in a dynamic read circuit for a memory bit cell is provided. The leakage-aware activation control circuit comprises means for providing an NFET leakage indicator indicating leakage current of at least one NFET in a dynamic read circuit. The leakage-aware activation control circuit also comprises means for providing a PFET leakage indicator indicating leakage current of at least one PFET in the dynamic read circuit. The leakage-aware activation control circuit also comprises means for receiving the NFET leakage indicator and the PFET leakage indicator. The leakage-aware activation control circuit also comprises means for comparing the NFET leakage indicator to the PFET leakage indicator. The leakage-aware activation control circuit also comprises means for generating a FET leakage signal based on the comparison of the NFET leakage indicator to the PFET leakage indicator. The leakage-aware activation control circuit also comprises means for adaptively generating at least one control signal based on the FET leakage signal to control activation timing of a delayed keeper circuit.

In another exemplary aspect, a method for controlling activation of a delayed keeper circuit in a dynamic read circuit for a memory bit cell is provided. The method comprises determining leakage current of at least one NFET in a dynamic read circuit. The method also comprises determining leakage current of at least one PFET in the dynamic read circuit. The method also comprises comparing the determined leakage current of at least one NFET to the determined leakage current of the at least one PFET. The method also comprises adaptively generating at least one control signal for a delayed keeper circuit based on the comparison of the determined leakage current of the at least one NFET to the determined leakage current of the at least one PFET.

In another exemplary aspect, a memory system is provided. The memory system comprises a memory bit cell comprising a storage circuit configured to store a complement voltage and a read port circuit coupled to the storage circuit. The read port circuit is configured to generate the complement voltage on a dynamic node in response to a read operation. The memory system also comprises a dynamic read circuit. The dynamic read circuit comprises the dynamic node, and a delayed keeper circuit configured to be activated in response to a pulse to keep the complement voltage on the dynamic node outside of an evaluation phase, and configured to be deactivated in response to the pulse, in response to the evaluation phase of the read operation. The memory system also comprises a leakage-aware activation control circuit. The leakage-aware activation control circuit comprises a leakage circuit configured to generate a FET leakage signal based on a comparison of leakage current of at least one NFET to leakage current of at least one PFET. The leakage-aware activation control circuit also comprises a control signal generator configured to adaptively generate at least one control signal based on the FET leakage signal to control activation timing of a second delayed keeper circuit. The memory system also comprises a pulse generator configured to generate the pulse having a pulse width based on a control activation timing for activation and deactivation of the second delayed keeper circuit in response to the at least one control signal.

BRIEF DESCRIPTION OF THE FIGURES

FIG. 9 is a logic table illustrating an exemplary leakage FET leakage control word generated by the leakage-aware activation control circuit in FIG. 6 for controlling activation timing of the delayed keeper circuit based on the various NFET leakage indicator and PFET leakage indicator ratios;

FIG. 10 is a listing of exemplary logic statements for the leakage-aware activation control circuit in FIG. 6 for generating a FET leakage control word according to the logic table in FIG. 9 for controlling activation timing of the delayed keeper circuit;

DETAILED DESCRIPTION

Figure 1:
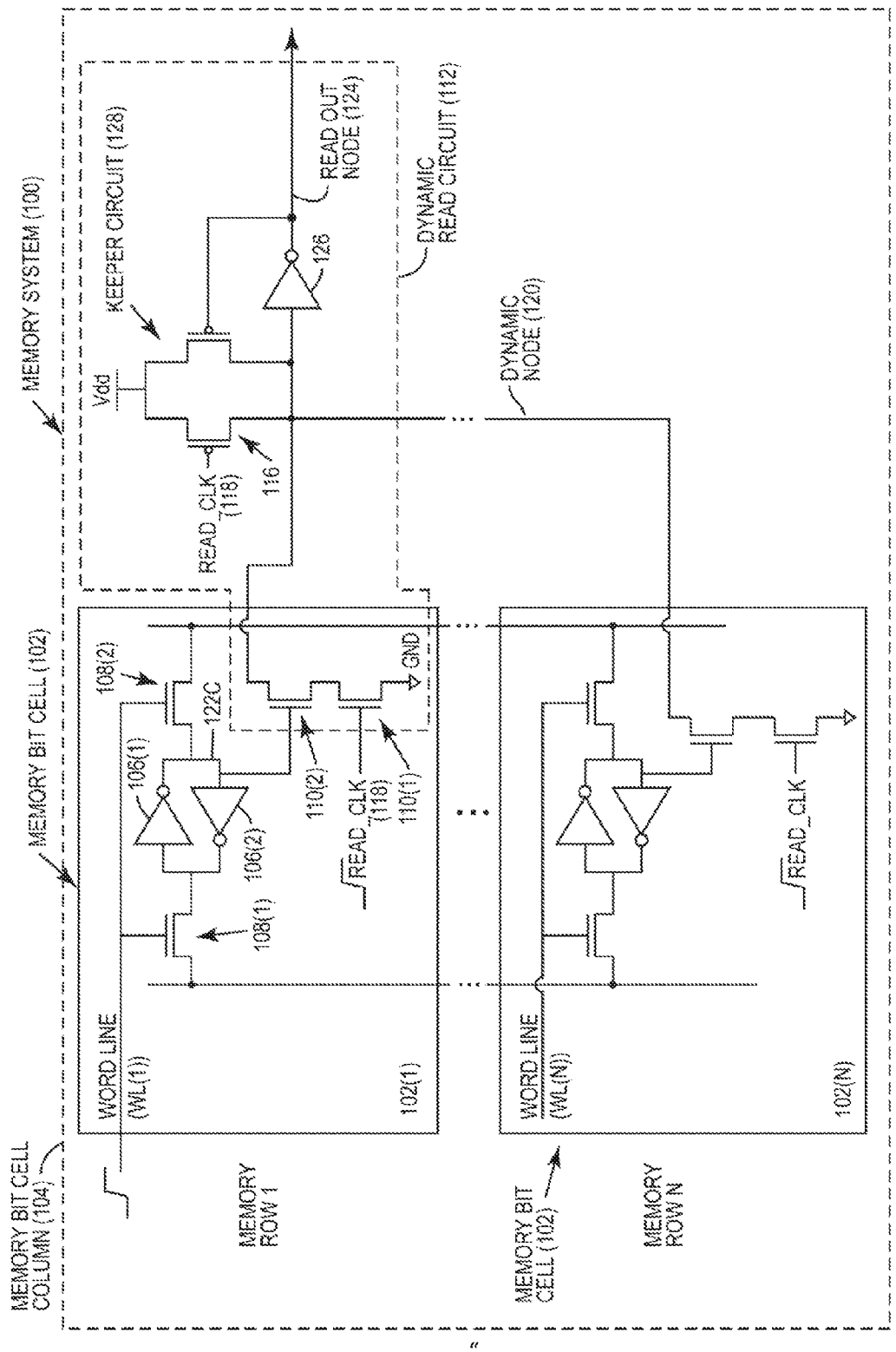
FIG. 1 is a schematic diagram of an exemplary memory system employing eight (8) transistor (T) (8-T) memory bit cells and a dynamic read circuit for performing read operations on the memory bit cells.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
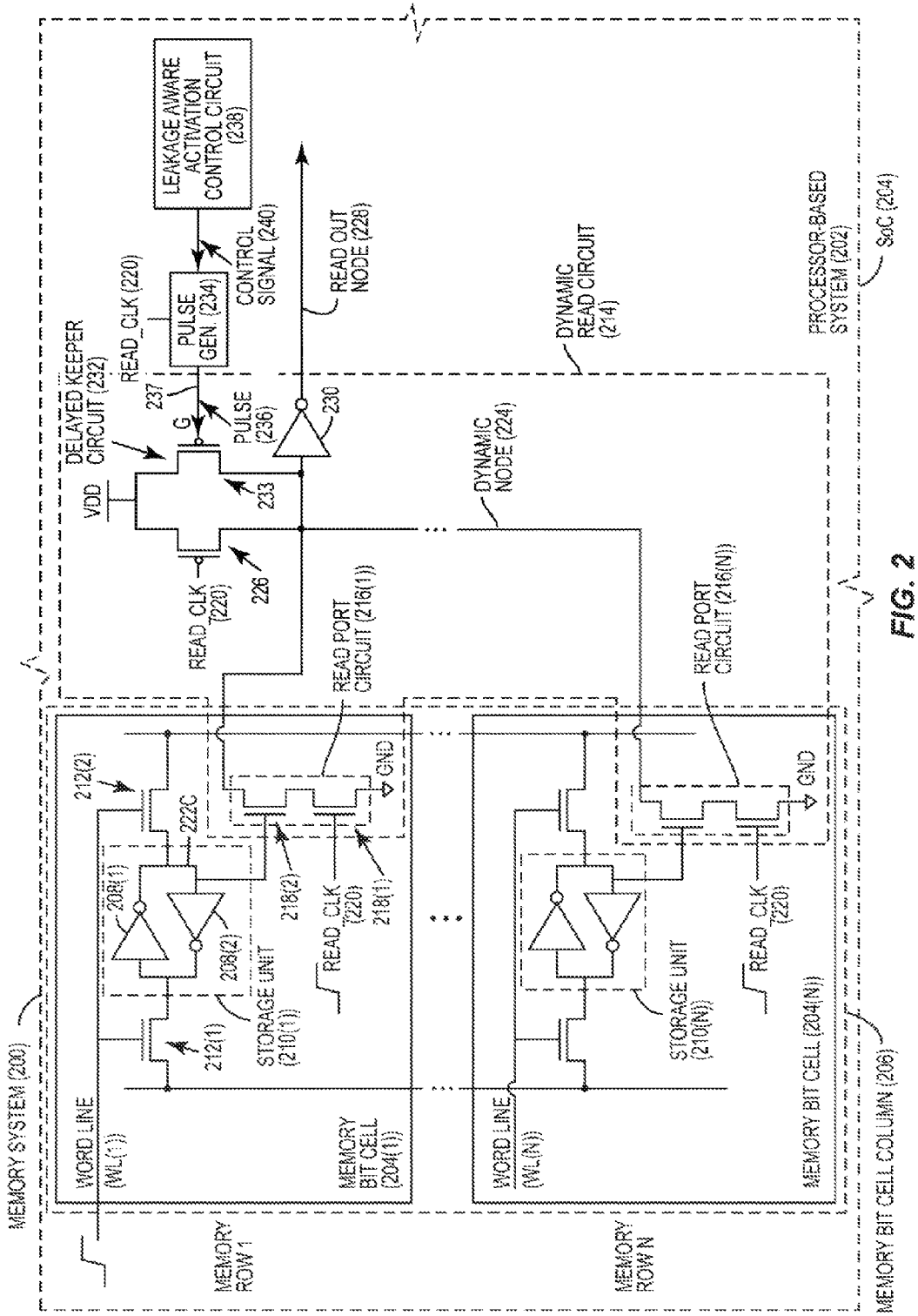
FIG. 2 is a circuit diagram of an exemplary memory system comprising a plurality of memory bit cells and a dynamic read circuit employing a leakage-aware activation control circuit for controlling activation timing of a delayed keeper circuit based on a comparison of N-type Field-Effect Transistor(s) (NFET(s)) leakage current to P-type FET(s) (PFET(s)) leakage current, in response to a read operation.

FIG. 2 illustrates a memory system 200 that can be included in a processor-based system 202. The processor-based system 202 may be provided in a system-on-a-chip (SoC) 204 as an example. The memory system 200 employs a plurality of memory bit cells 204(1)-204(N) for storing data, wherein 'N' can be any number of rows of memory bit cells 204(1)-204(N) desired. Each memory bit cell 204(1)-204(N) is capable of storing a single bit of information. In FIG. 2, a single memory bit cell column 206 is shown that contains the plurality of memory bit cells 204(1)-204(N). However, note that multiple memory bit cell columns 206 may be provided in the memory system 200 to provide a data array of the memory bit cells 204(1)-204(N). In this example, using memory bit cell 204(1) as a reference example indicative of each memory bit cell 204(1)-204(N), the memory bit cell 204(1) includes two (2) cross-coupled inverters 208(1), 208(2) (i.e., four (4) transistors) to form a storage unit 210(1)-210(N) and two (2) access transistors 212(1), 212(2) in a six (6) transistor (T) (6-T) complementary memory bit cell arrangement. The two (2) access transistors 212(1), 212(2) are configured to be activated by a row word line WL(1), WL(N) for the accessed memory row 1 of memory bit cells 204(1)-204(N) for performing read and write operations.

With continuing reference to FIG. 2, a dynamic read circuit 214 is provided in the memory system 200 for performing read operations on the selected memory bit cell 204(1)-204(N). The assertion of a particular word line WL(1)-WL(N) for a given respective memory row 1-N controls which memory bit cell 204(1)-204(N) is read by the dynamic read circuit 214 during a read operation. With regard to memory bit cell 204(1) as an example, a read port circuit 216(1) is provided for the memory bit cell 204(1) as part of the dynamic read circuit 214 for read operations on the memory bit cell 204(1). The read port circuit 216(1) in this example is an NFET-based read port circuit that contains two (2) transistors, a pull-down NFET 218(1) and a read port NFET 218(2), to provide for the memory bit cell 204(1) to be provided as an eight (8) transistor (8-T) memory bit cell. The pull-down NFET 218(1) is activated in response to a read clock signal (read_clk) 220 in response to a read operation. The read port NFET 218(2) is activated based on the voltage (i.e., data) on a complement node 222C being a logical high level, which causes a dynamic node 224 of the dynamic read circuit 214 to be pulled to ground (GND). The read port NFET 218(2) is deactivated based on the voltage (i.e., data) on the complement node 222C being a logical low level, which causes the dynamic node 224 of the dynamic read circuit 214 to retain its charge to voltage Vdd. In either case, the memory bit cell 204(1) is configured to generate a voltage on the dynamic node 224 to be the voltage on the complement node 222C in response to a read operation. Providing the additional pull-down NFET 218(1) and read port NFET 218(2) in the read port circuit 216(1) decouples write performance of the memory bit cell 204(1) from read performance of the memory bit cell 204(1).

During a pre-charge phase of the memory bit cell 204(1), a pre-charge PFET 226 in the dynamic read circuit 214 is activated in response to the read clock signal (read_clk) 220 being a low logic level indicating that a read operation is not active. This causes the dynamic node 224 in the dynamic read circuit 214 to be pre-charged to voltage Vdd. Then, during an evaluation phase in response to the read clock signal (read_clk) 220 being a logic high level indicating a read operation is active, the pre-charge PFET 226 is turned off, and the pull-down NFET 218(1) is activated to be coupled to ground (GND). If the charge on the complement node 222C in the memory bit cell 204(1) is a logical '1' (i.e., voltage Vdd) during a read operation, the read port NFET 218(2) is activated to pull the dynamic node 224 down to ground (GND). Pulling the dynamic node 224 to ground (GND) will cause a logical '1' to be generated on a read out node 228 by an inverter 230. However, a delayed keeper circuit 232 provided in the dynamic read circuit 214, which is a PFET-based delayed keeper circuit comprised of a PFET 233 in this example, is turned off when the read operation is activated. But the delayed keeper circuit 232 is then turned on after a designed amount of time that is not sensitive to leakage currents of PFETs and NFETs. If the delayed keeper circuit 232 is turned on too early and its leakage is large relative to the pull down NFET 218(1) and read port NFET 218(2) when the node 222C is at a logic "1", the dynamic node 224 will be pulled up towards voltage Vdd in contention with the pull-down NFET 218(1) in the read port circuit 216(1).

To avoid or reduce this contention between the delayed keeper circuit 232 and the pull-down NFET 218(1) in the read port circuit 216(1) on the dynamic node 224 in the memory system 200 in FIG. 2, a pulse generator 234 is provided as shown in FIG. 2. The pulse generator 234 is configured to activate and deactivate the delayed keeper circuit 232 in response to the read clock signal (read_clk) 220 to avoid or reduce contention between the delayed keeper circuit 232 and the pull-down NFET 218(1) in the read port circuit 216(1). The pulse generator 234 is configured to generate a pulse 236 in response to the read clock signal (read_clk) 220 indicating a read operation. In this example, the pulse 236 is provided to a gate (G) of the delayed keeper circuit 232. Thus, initially during the evaluation phase of the dynamic read circuit 214, the pulse generator 234 generates the pulse 236 on an output node 237 to initially deactivate the delayed keeper circuit 232 to avoid contention with the pull-down NFET 218(1) on the dynamic node 224. In this example, the pulse 236 generated by the pulse generator 234 is an active low pulse, because the delayed keeper circuit 232 is a PFET activated by a lower signal level in this example. A pulse width of the pulse 236 is controlled by the pulse generator 234 to control deactivation of the delayed keeper circuit 232 for the desired period of time to allow for the pull-down NFET 218(1) to perform the evaluation phase on the dynamic node 224. Thereafter, during a subsequent keep phase of the dynamic read circuit 214, the pulse 236 expires on the output node 237, which activates the delayed keeper circuit 232 to keep the read voltage (i.e., data) on the dynamic node 224.

Thus, as discussed above, the timing control of generation of the pulse 236 by the pulse generator 234 in the memory system 200 is critical to avoid or reduce contention between the delayed keeper circuit 232 and the pull-down NFET 218(1) in the read port circuit 216(1). The activation timing control may be designed based on the drive strengths of the transistors in the delayed keeper circuit 232 and the pull-down NFET 218(1) in the read port circuit 216(1) at design. However, the drive strengths of the transistors in the delayed keeper circuit 232 and the pull-down NFET 218(1) may vary from design parameters because of factors, such as process variation and technology node scaling. As a result of these variations in transistor drive strengths, the transistor drive strength of the delayed keeper circuit 232 may be stronger than expected in design over the read port circuit 216(1). In this scenario, the generation of the pulse 236 by the pulse generator 234 may not be delayed long enough to avoid or reduce contention between the delayed keeper circuit 232 and the pull-down NFET 218(1) in the read port circuit 216(1). On the other hand, if the transistor drive strength of the read port circuit 216(1) is stronger than expected in design over the delayed keeper circuit 232, the generation of the pulse 236 by the pulse generator 234 may be delayed too long to avoid or reduce contention between the delayed keeper circuit 232 and the pull-down NFET 218(1) in the read port circuit 216(1).

Figure 3B:
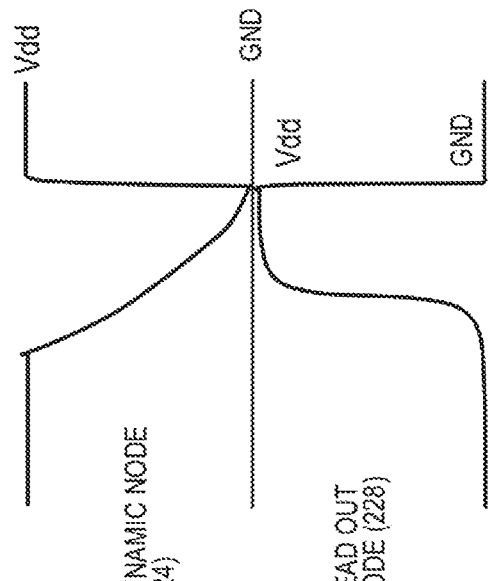
FIG. 3B is a timing diagram illustrating activation of a delayed keeper circuit in the dynamic read circuit in FIG. 2 being delayed too long, thereby causing the dynamic node in the dynamic read circuit to droop down to ground causing an incorrect read out value to be generated in response to a read operation.
Figure 3A:
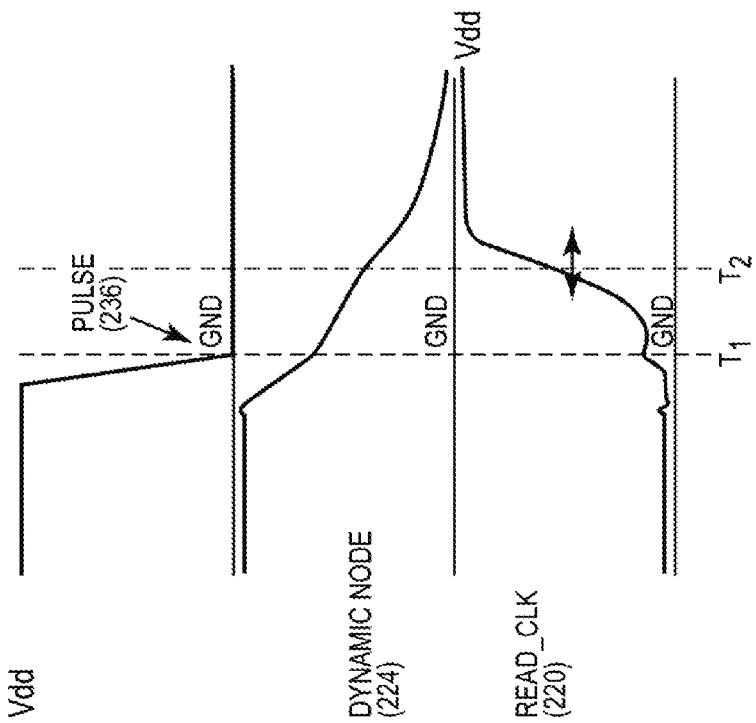
FIG. 3A is a timing diagram illustrating activation of a keeper circuit in the dynamic read circuit in FIG. 2 not being delayed long enough, thereby pushing out pull-down of a dynamic node in the dynamic read circuit and impacting read performance.

For example, if the complement node 222C in the memory bit cell 204(1) in FIG. 2 has a logical '1' state prior to the read operation, and the generation of the pulse 236 at time $T_1$ to activate the delayed keeper circuit 232 is too early or not delayed enough, as shown in FIG. 3A, the pull-down of the dynamic node 224 by the pull-down NFET 218(1) is pushed out in time at time $T_2$. In this manner, the delayed keeper circuit 232 being activated too early delays the read out of the memory bit cell 204(1) and impacts read performance. Further, if the complement node 222C in the memory bit cell 204(1) in FIG. 2 has a logical '0' state prior to the read operation, and the activation of the delayed keeper circuit 232 is delayed too long and the leakage current of the delayed keeper circuit 232 is strong, as shown in FIG. 3B, the dynamic node 224 droops to ground (GND). This can cause the delayed keeper circuit 232 to store a logical '0' instead of a logical '1', thereby causing a read out of a logical '1' value at the read out node 228 instead of the correct logical '0' value.

Figure 4:
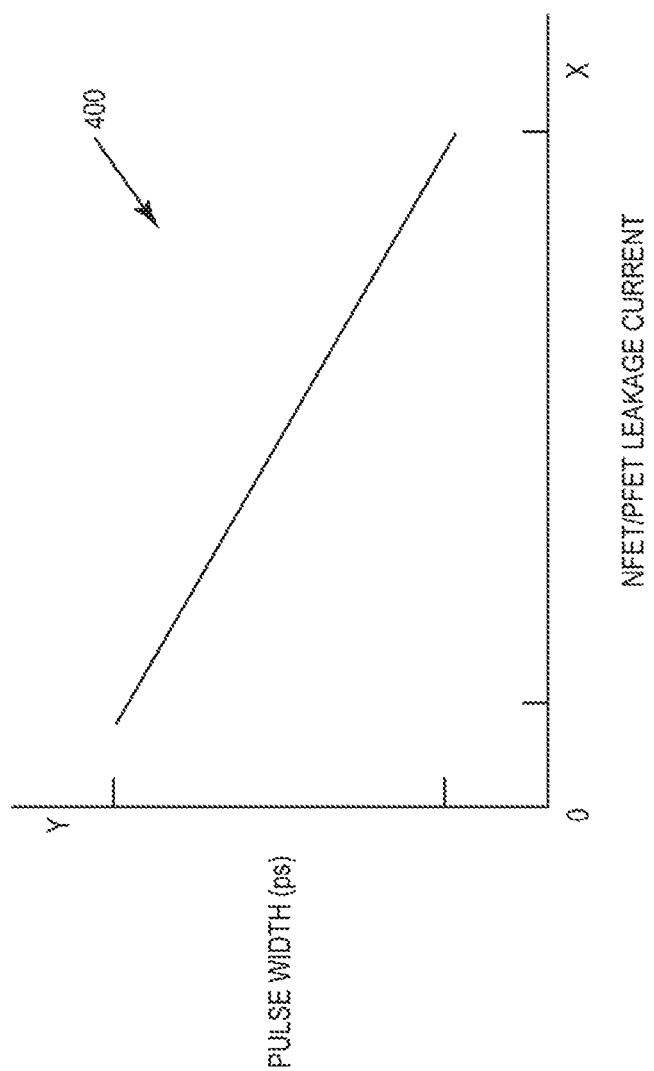
FIG. 4 is graph illustrating an exemplary relationship between a ratio of NFET to PFET leakage current/strength and activation timing of the delayed keeper circuit in the dynamic read circuit in FIG. 2.

The relationship of transistor leakage current in the delayed keeper circuit 232 to the read port circuit 216(1) is recognized as shown in chart 400 in FIG. 4 in this example. As shown in the chart 400 in FIG. 4, as the ratio of NFET leakage current (i.e., drive strength) to PFET leakage current (i.e., drive strength) decreases, the pulse width of the pulse 236 needs to be increased to avoid pushing out the pull-down of the dynamic node 224 and impacting the read performance as discussed above with regard to FIG. 3A. However, as shown in the chart 400 in FIG. 4, as the ratio of NFET leakage current (i.e., drive strength) to PFET leakage current (i.e., drive strength) increases, the pulse width of the pulse 236 needs to be decreased to activate the delayed keeper circuit 232 sooner than the dynamic node 224 droops to ground (GND), and subsequently reads out the wrong data (logical "1" instead of "0"), as discussed above with regard to FIG. 3B.

In this regard, the memory system 200 in FIG. 2 includes a leakage-aware activation control circuit 238. As will be discussed in more detail below, the leakage-aware activation control circuit 238 is configured to adaptively control the activation timing of the delayed keeper circuit 232 based on a comparison of NFET leakage current to PFET leakage current. The leakage-aware activation control circuit 238 is configured to generate a control signal 240 to control the activation timing of the pulse width of the pulse 236 generated by the pulse generator 234 based on the comparison of NFET leakage current to PFET leakage current. As discussed above, the delayed keeper circuit 232 in the memory system 200 in FIG. 2 includes a PFET. The read port circuits 216(1)-216(N) include the pull-down NFET 218(1). PFET leakage current and NFET leakage current are related to their respective transistor drive strengths. Thus, the leakage-aware activation control circuit 238 is configured to adaptively control the activation timing of the delayed keeper circuit 232 based on a comparison of NFET leakage current to PFET leakage current. Thus, adjustments to the pulse width of the pulse 236 can be made during operation to account for variations in transistor drive strength due to variations in design and/or fabrication of the NFET and PFET transistors in the memory system 200 to allow the dynamic read circuit 214 to more accurately provide the read data from the memory bit cells 204(1)-204(N).

Figure 5:
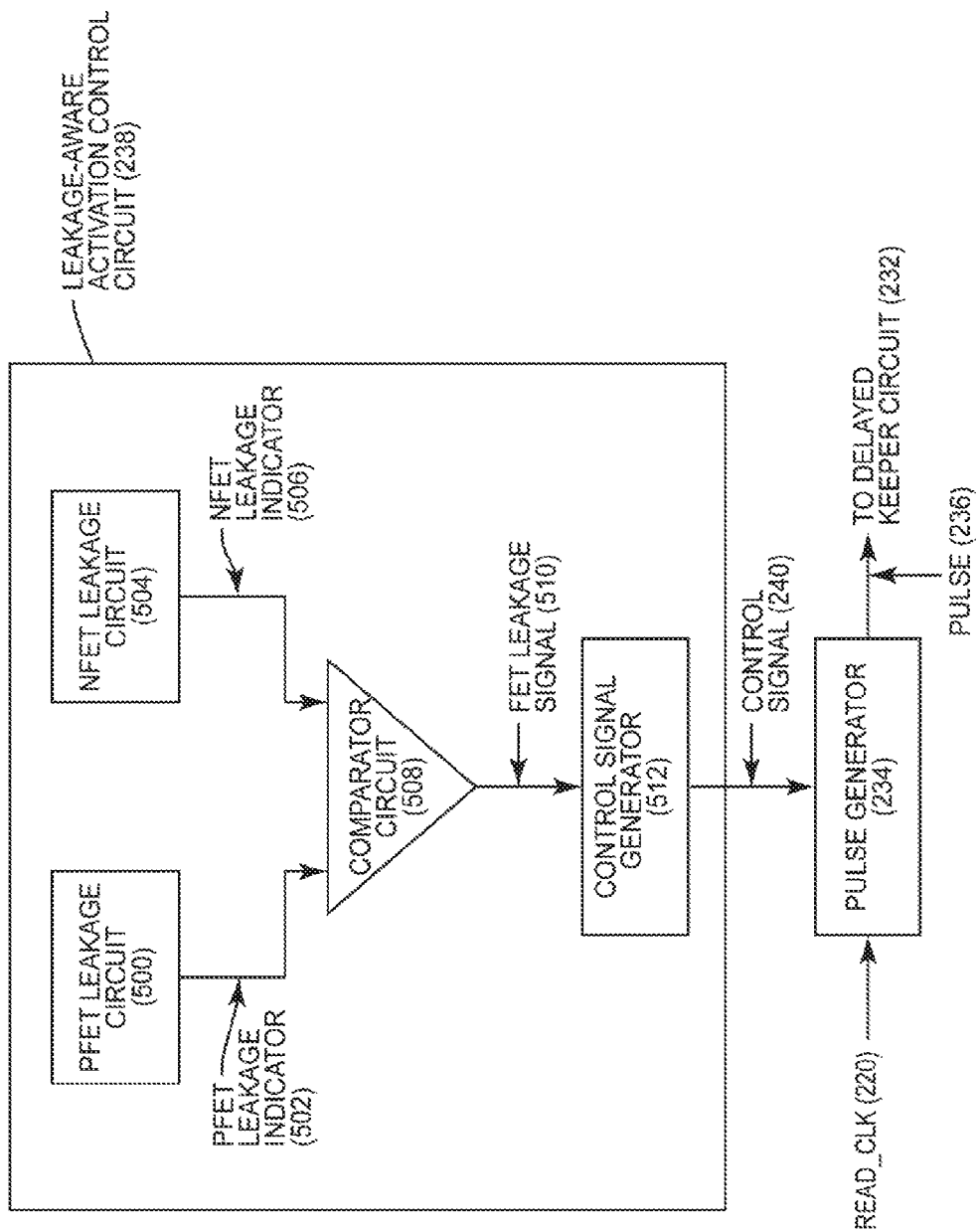
FIG. 5 is a schematic diagram of an exemplary leakage-aware activation control circuit that can be provided in the dynamic read circuit in FIG. 2 for generating at least one control signal to control activation timing of a pulse provided to a delayed keeper circuit to control activation timing of the delayed keeper circuit based on a comparison of NFET leakage current to PFET leakage current.

In this regard, FIG. 5 is a schematic diagram of the leakage-aware activation control circuit 238 provided in the memory system 200 in FIG. 2 to adaptively control the activation timing of the delayed keeper circuit 232 based on a comparison of NFET leakage current to PFET leakage current. As shown in FIG. 5, the leakage-aware activation control circuit 238 includes a PFET leakage circuit 500 configured to provide a PFET leakage indicator 502 indicating leakage current of at least one PFET in the dynamic read circuit 214. For example, the PFET leakage circuit 500 could include one or more PFETs that are located in a same integrated circuit (IC) and/or area of the IC as the delayed keeper circuit 232 of the memory system 200 in this example to provide for the PFET leakage indicator 502 providing an indication of the PFET leakage current in the delayed keeper circuit 232. The PFET leakage circuit 500 may also be configured to provide the PFET leakage indicator 502 during operation of the dynamic read circuit 214 if it is desired to measure PFET leakage current that the dynamic read circuit 214 may be experiencing during operation. Further, the leakage-aware activation control circuit 238 also includes an NFET leakage circuit 504 configured to provide an NFET leakage indicator 506 providing an indication of NFET leakage current of at least one NFET in the dynamic read circuit 214. Also, the NFET leakage circuit 504 could include one or more NFETs that are located in the same IC and/or area of the IC as the read port circuits 216(1)-216(N) of the memory system 200 in this example to provide for the NFET leakage indicator 506 providing an indication of the NFET leakage current in the read port circuits 216(1)-216(N). The NFET leakage circuit 504 may also be configured to provide the NFET leakage indicator 506 during operation of the dynamic read circuit 214 if it is desired to measure NFET leakage current that the dynamic read circuit 214 may be experiencing during operation.

With continuing reference to FIG. 5, the leakage-aware activation control circuit 238 also includes a comparator circuit 508. The comparator circuit 508 is configured to receive the PFET leakage indicator 502 and the NFET leakage indicator 506, and compare the PFET leakage indicator 502 to the NFET leakage indicator 506. The comparator circuit 508 is configured to generate a FET leakage signal 510 based on the comparison of the PFET leakage indicator 502 to the NFET leakage indicator 506. The FET leakage signal 510 is provided to a control signal generator 512 configured to adaptively generate the control signal 240 based on the FET leakage signal 510 to control activation timing of the delayed keeper circuit 232. As discussed above, in this example, the control signal 240 controls activation timing of the pulse 236 generated by the pulse generator 234, as shown in FIG. 5, to control the activation timing of the delayed keeper circuit 232 in this example. Note that the pulse generator 234 is not required. The leakage-aware activation control circuit 238 could be configured to generate the control signal 240 and provide it directly to the delayed keeper circuit 232 to control the activation timing of the delayed keeper circuit 232.

The ratio of leakage current of NFETs to PFETs can vary based on design and fabrication processes. Thus, it may be desired to provide for a leakage-aware activation control circuit 238 that has the capability to generate control signals based on various operation speed scenarios of NFET to PFET leakage current. For example, PFETs and/or NFETs may vary from their nominal (expected) behavior and switching speed, and may operate with relatively slower or faster switching speeds depending on variations in fabrication processes that affect voltage and temperature variations within an IC (in circuit simulation terms, a slow corner represents a slowest expected behavior of a device, a nominal corner represents average expected behavior, and a fast corner represents the fastest expected behavior). Such variations in the fabrication process affects the leakage currents of the NFETs and PFETs. Additionally, a PFET may vary differently as a result of the fabrication process than an NFET, and thus may experience different variation in switching speed than an NFET, and vice versa. For example, a fabricated PFET may be a slower device, while a fabricated NFET may be a faster device. Leakage current of PFETs and NFETs is related to switching speed, with faster devices having greater leakage current. Thus, because of these switching speed differences that can occur in fabricated PFETs and NFETs, it may be desired for the leakage-aware activation control circuit 238 to take the relative switching speed of the PFETs and NFETs into consideration when determining how to control the activation timing of the delayed keeper circuit 232.

Figure 6:
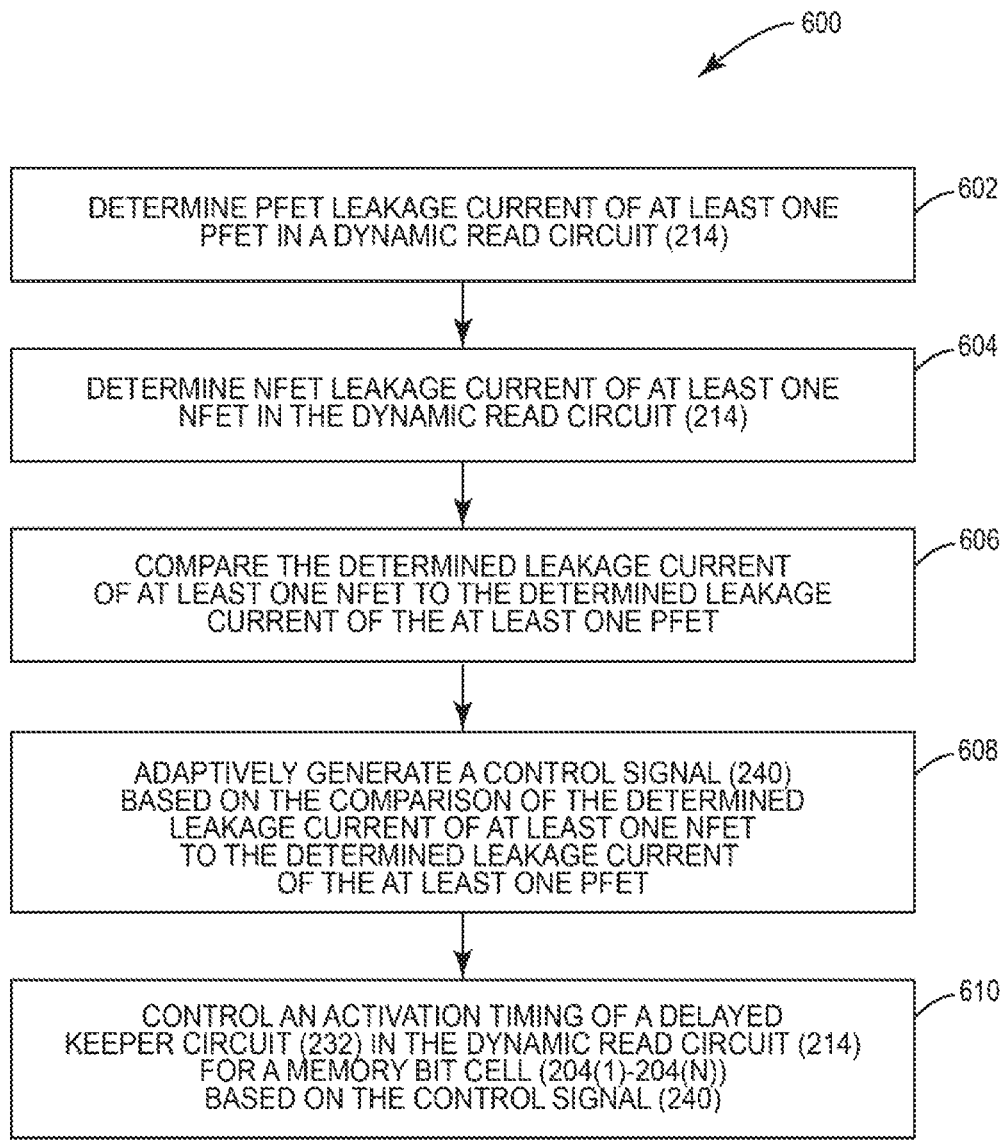
FIG. 6 is a flowchart illustrating an exemplary process of controlling the activation timing of the delayed keeper circuit in the dynamic read circuit in FIG. 5 for read operations in a memory bit cell.

FIG. 6 is a flowchart illustrating generally an exemplary process 600 of the leakage-aware activation control circuit 238 in FIG. 2 controlling the activation timing of the delayed keeper circuit 232 in the dynamic read circuit 214. As shown therein, the process 600 determines the PFET leakage current of at least one PFET in the dynamic read circuit 214 (block 602). The process 600 also includes determining NFET leakage current of at least NFET in the dynamic read circuit 214 (block 604). The determined leakage current of at least one NFET is compared to the determined leakage current of the at least one PFET (block 606). At least one control signal 240 is adaptively generated for the delayed keeper circuit 232 based on the comparison of the determined leakage current of the at least one NFET to the determined leakage current of the at least one PFET (block 608). The process 600 can also include controlling an activation timing of the delayed keeper circuit 232 in the dynamic read circuit 214 for a memory bit cell 204(1)-204(N) based on the at least one control signal 240 (block 610).

Figure 7:
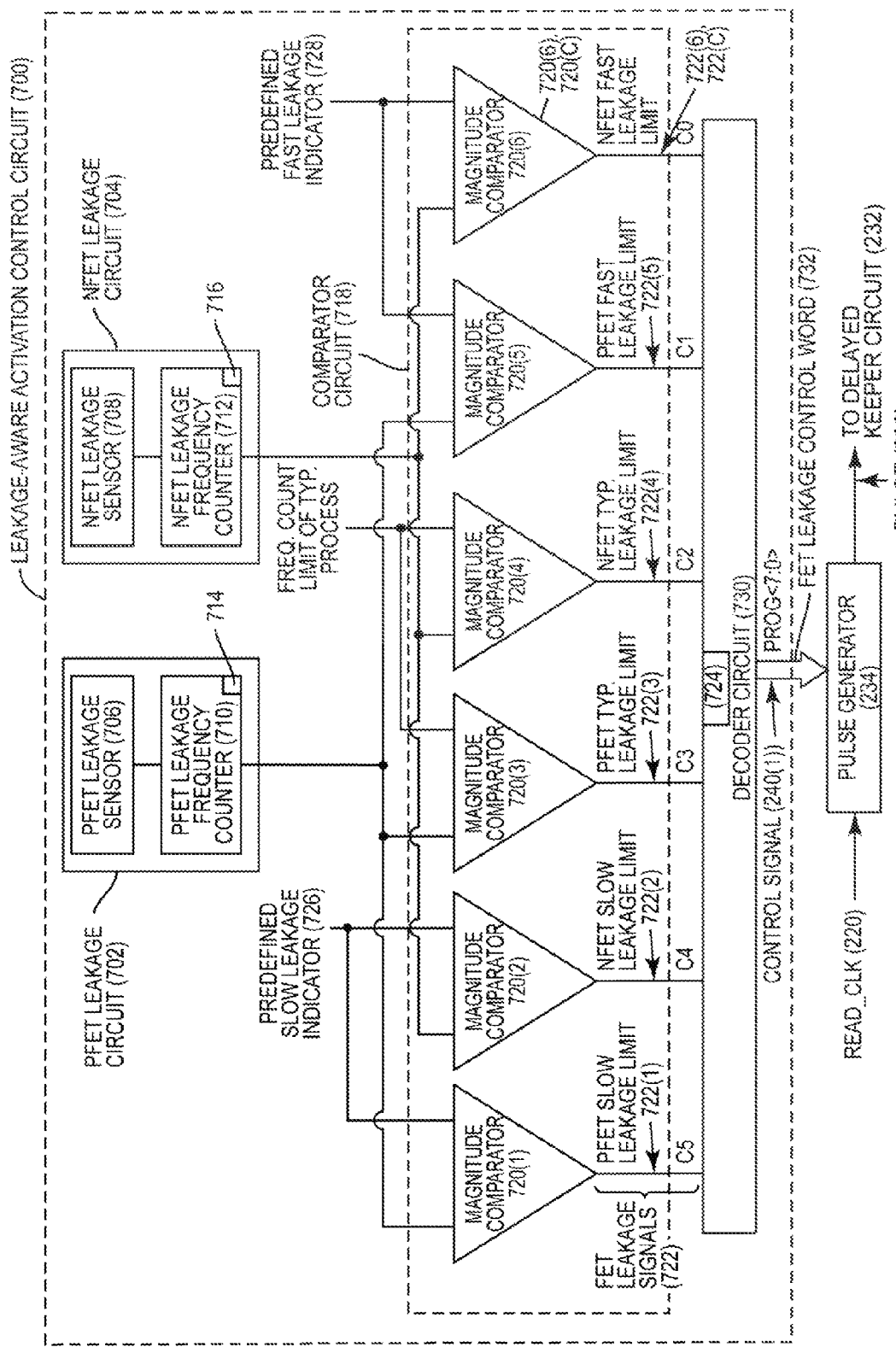
FIG. 7 is a schematic diagram of another exemplary leakage-aware activation control circuit that can be provided in the dynamic read circuit in FIG. 2 for generating a control signal to control activation timing of a pulse provided to the delayed keeper circuit to control activation timing of the delayed keeper circuit based on a comparison of NFET leakage current to PFET leakage current.

FIG. 7 is a schematic diagram of another exemplary leakage-aware activation control circuit 700 that can be provided in the dynamic read circuit 214 in FIG. 2. As discussed below, the leakage-aware activation control circuit 700 is configured to generate a control signal 240(1) that can be used to control the timing of the generation of the pulse 236 by the pulse generator 234 to the activation timing of the delayed keeper circuit 232 in FIG. 2, based on a comparison of NFET leakage current to PFET leakage current. In this regard, a PFET leakage circuit 702 and an NFET leakage circuit 704 are provided to determine the leakage current of a PFET(s) and NFET(s), respectively. In this example, the PFET leakage circuit 702 includes a PFET leakage sensor 706 that is configured to sense leakage current of a PFET(s). Similarly, the NFET leakage circuit 704 includes an NFET leakage sensor 708 that is configured to sense leakage current of an NFET(s). As discussed above, the PFET leakage sensor 706 and/or the NFET leakage sensor 708 can be provided in the same circuit or area of an IC containing the dynamic read circuit 214 in FIG. 2 so that the determined leakage current of a PFET(s) and/or NFET(s) is indicative of the leakage current of PFET(s) and/or NFET(s) in the dynamic read circuit 214.

Figure 8A:
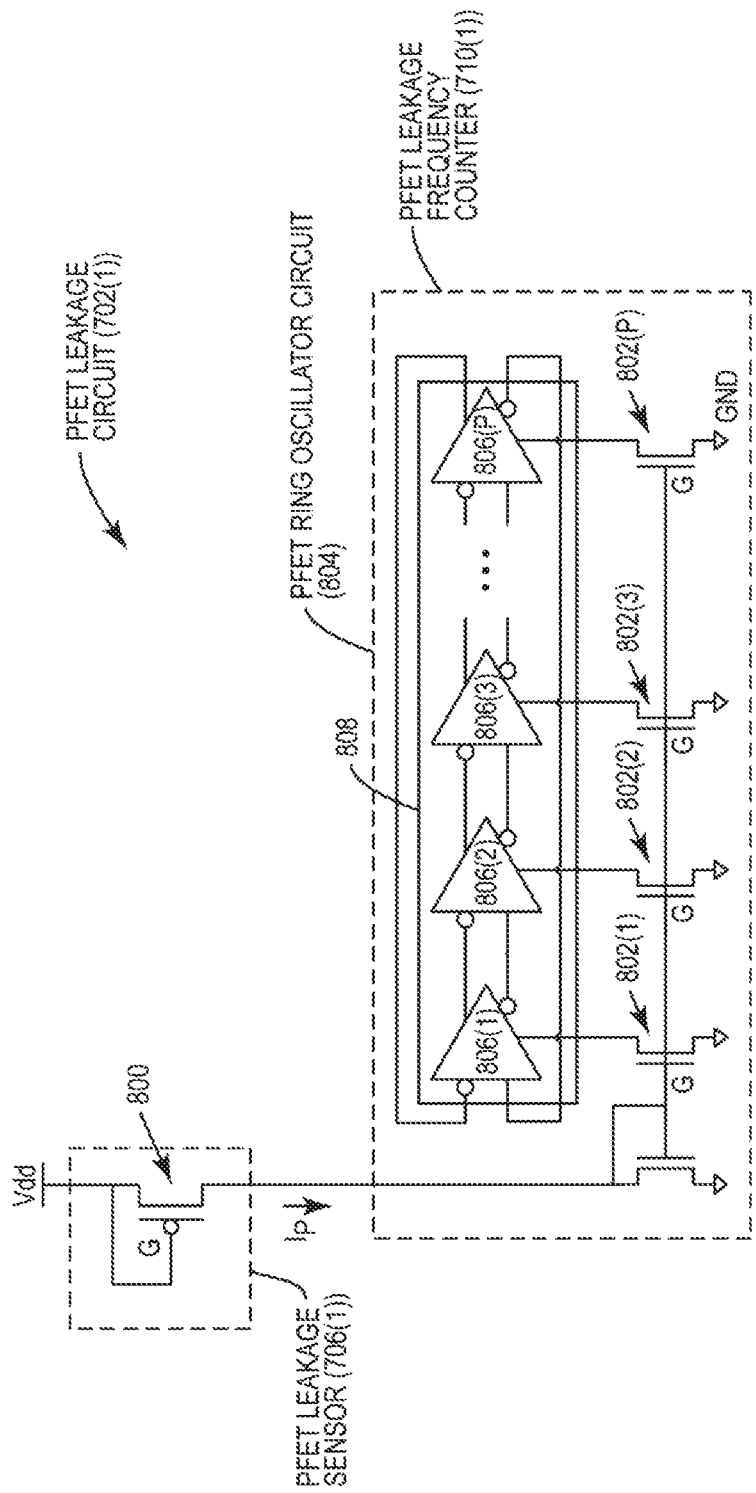
FIG. 8A is a circuit diagram of an exemplary NFET leakage circuit that can be employed in a leakage-aware activation control circuit in the dynamic read circuit in FIG. 2, wherein the NFET leakage circuit is configured to provide an NFET leakage indicator indicating leakage current of at least one NFET in the dynamic read circuit.

With continuing reference to FIG. 7, the PFET leakage circuit 702 and NFET leakage circuit 704 also contain a PFET leakage frequency counter 710 and an NFET leakage frequency counter 712, respectively. The PFET leakage frequency counter 710 and an NFET leakage frequency counter 712 are configured to store a PFET leakage frequency count 714 and an NFET leakage frequency count 716, respectively, indicative of the leakage current of a PFET(s) and NFET(s). The PFET leakage sensor 706 and NFET leakage sensor 708 are configured to update the PFET leakage frequency count 714 and NFET leakage frequency count 716 in the respective PFET leakage frequency counter 710 and NFET leakage frequency counter 712, respectively, as a function of the determined leakage current of the PFET(s) and NFET(s). For example, an example of the PFET leakage circuit 702 in FIG. 7 is provided as a PFET leakage circuit 702(1) in FIG. 8A. As illustrated therein, a PFET leakage sensor 706(1) is provided that is comprised of a PFET 800. A gate (G) of the PFET 800 is tied to voltage Vdd so that the PFET 800 is turned off or deactivated. Thus, any PFET leakage current $I_P$ is provided to a PFET leakage frequency counter 710(1) as leakage current from the PFET 800. The PFET leakage current $I_P$ is coupled to a series of gates (G) of NFETs 802(1)-802(P) in a PFET ring oscillator circuit 804 in the PFET leakage circuit 702(1). The NFETs 802(1)-802(P) are each configured to control activation of a respective buffer circuit 806(1)-806(P) configured in an oscillation loop 808 in the PFET ring oscillator circuit 804. Thus, the strength of the PFET leakage current $I_P$ controls the turn on strength of the NFETs 802(1)-802(P) in the PFET ring oscillator circuit 804, which in turn controls the speed or oscillation of the buffer circuits 806(1)-806(P) to provide an indication of the PFET leakage current. If, for example, each iteration of the oscillation loop 808 could be used to increment a PFET leakage frequency count, such as the PFET leakage frequency count 714 in FIG. 7.

Figure 8B:
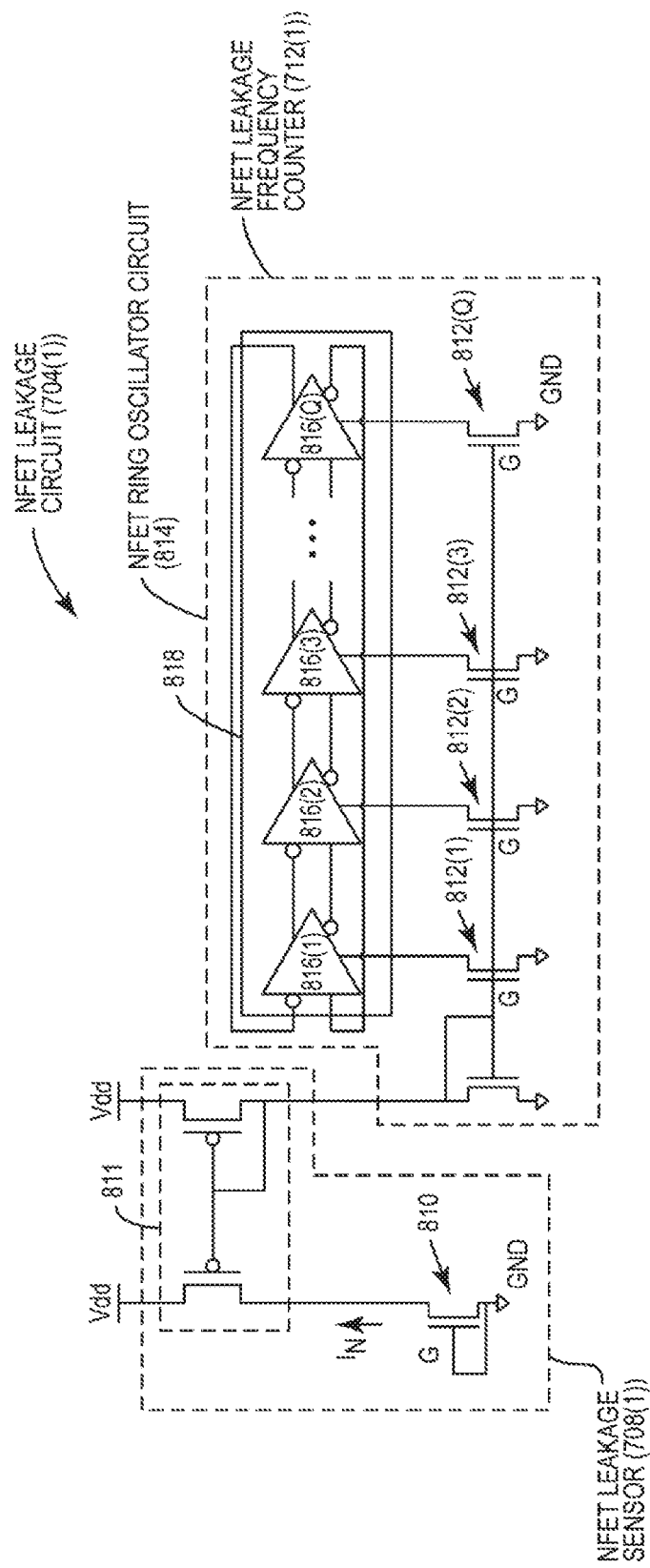
FIG. 8B is a circuit diagram of an exemplary PFET leakage circuit that can be employed in a leakage-aware activation control circuit in the dynamic read circuit in FIG. 2, wherein the PFET leakage circuit is configured to provide a PFET leakage indicator indicating leakage current of at least one PFET in the dynamic read circuit.

Similarly, an example of the NFET leakage circuit 704 in FIG. 7 is provided as an NFET leakage circuit 704(1) in FIG. 8B. As illustrated therein, an NFET leakage sensor 708(1) is provided that is comprised of an NFET 810 and a PFET current mirror 811. A gate (G) of the NFET 810 is tied to ground (GND) so that the NFET 810 is turned off or deactivated. Thus, any NFET leakage current $I_N$ is provided to an NFET leakage frequency counter 712(1) as leakage current from the NFET 810. The NFET leakage current $I_N$ is coupled to a series of gates (G) of NFETs 812(1)-812(Q) in an NFET ring oscillator circuit 814 in the NFET leakage circuit 704(1). The NFETs 812(1)-812(Q) are each configured to control activation of a respective buffer circuit 816(1)-816(Q) configured in an oscillation loop 818. Thus, the strength of the NFET leakage current $I_N$ controls the turn on strength of the NFETs 812(1)-812(Q) in the NFET ring oscillator circuit 814, which in turn controls the speed or oscillation of the buffer circuits 816(1)-816(Q) to provide an indication of the NFET leakage current. If, for example, each iteration of the oscillation loop 818 could be used to increment an NFET leakage frequency count, such as the NFET leakage frequency count 716 in FIG. 7.

With reference back to the leakage-aware activation control circuit 700 in FIG. 7, a comparator circuit 718 is provided that is configured to compare the PFET leakage current to the NFET leakage current. In this example, the comparator circuit 718 receives the PFET leakage frequency count 714 and the NFET leakage frequency count 716 from the respective PFET leakage circuit 702 and NFET leakage circuit 704 as an indication of the PFET leakage current to the NFET leakage current, respectively. The comparator circuit 718 is comprised of a plurality of comparators 720(1)-720(C). Each comparator 720(1)-720(C) is configured to make certain comparisons based on the PFET leakage current and/or the NFET leakage current to generate respective FET leakage signals 722(1)-722(C) to provide a FET leakage control signal 724 indicative of the ratio of the PFET leakage current and/or the NFET leakage current. As discussed below, by providing a plurality of comparators 720(1)-720(C), the comparators 720(1)-720(C) can each be configured differently to determine if the PFET leakage current and/or the NFET leakage current indicates a slow, nominal (typical), or fast leakage current. In this manner, the FET leakage signals 722(1)-722(C) can be combined to form the FET leakage control signal 724 to enable more precise control of a delayed keeper circuit, such as the delayed keeper circuit 232 in FIG. 2, based on the relative PFET leakage current and NFET leakage current, and speed of the PFET and NFET devices.

In this regard, the comparator circuit 718 in the leakage-aware activation control circuit 700 in FIG. 7 includes six (6) comparators 720(1)-720(6) in this example. Comparator 720(3) is configured as a PFET nominal leakage comparator circuit configured to compare the PFET leakage frequency count 714 to the NFET leakage frequency count 716 to indicate if the PFET(s) has a greater leakage current than the NFET(s). If so, comparator 720(3) generates a FET leakage signal 722(3) with such an indication. Similarly, comparator 720(4) is configured as an NFET nominal leakage comparator circuit configured to compare the NFET leakage frequency count 716 to the PFET leakage frequency count 714 to indicate if the NFET(s) has a greater leakage current than the PFET(s). If so, comparator 720(4) generates a FET leakage signal 722(4) with such an indication.

Further, comparator 720(1) is configured as a PFET slow leakage comparator circuit configured to compare the PFET leakage frequency count 714 to a predefined slow leakage indicator 726 (or limit). Comparator 720(2) is configured as an NFET slow leakage comparator circuit configured to compare the NFET leakage frequency count 716 to the predefined slow leakage indicator 726 (or limit). In this manner, comparators 720(1), 720(2) can provide FET leakage signals 722(1), 722(2), respectively, indicating if the determined leakage current of the PFET(s) and NFET(s) indicate slow speed devices, respectively. Further, comparator 720(5) is configured as a PFET fast leakage comparator circuit configured to compare the PFET leakage frequency count 714 to the predefined fast leakage indicator 728 (or limit). Comparator 720(6) is configured as an NFET fast leakage comparator circuit configured to compare the NFET leakage frequency count 716 to a predefined fast leakage indicator 728 (or limit). In this manner, comparators 720(5), 720(6) can provide FET leakage signals 722(5), 722(6), respectively, indicating if the determined leakage current of the PFET(s) and NFET(s) indicate fast speed devices, respectively.

Thus, with the FET leakage signals 722(1)-722(6), the comparator circuit 718 provides an indication of PFET leakage current to NFET leakage current, as well as whether the PFET(s) and NFET(s) are slow, nominal, or fast switching speed devices. The FET leakage signals 722(1)-722(6) form the FET leakage control signal 724. A decoder circuit 730 is provided in the leakage-aware activation control circuit 700 to decode the FET leakage control signal 724 into a FET leakage control word 732 as a control signal, which is eight (8) bits (<7:0>) in this example, as will be explained below. The FET leakage control word 732 can be provided to the pulse generator 234 to control the timing of generation of the pulse 236 and delayed keeper circuit 232 in the dynamic read circuit 214 in FIG. 2, as previously discussed above.

FIG. 9 is a logic table 900 illustrating exemplary FET leakage control words that can be generated by the leakage-aware activation control circuit 700 in FIG. 7 for controlling activation timing of the delayed keeper circuit 232 based on FET leakage signals 722(1)-722(6) provided by the comparator circuit 718. In this example, a process column 902 shows the various possible combinations of fast, slow, and nominal PFET and NFET devices. The Prog<0>-Prog<7> columns 904 illustrate the values of the bits in the FET leakage control word 732 based on the combinations of fast, slow, and nominal PFET and NFET devices. A pulse width column 906 illustrates the pulse width setting of the pulse 236 generated by the pulse generator 234 in response to the FET leakage control word 732. For example, a fast NFET leakage current (i.e., above the predefined fast leakage indicator) and slow PFET leakage current (i.e., below the predefined slow leakage indicator) is shown as indicating the "smallest" pulse width setting of the pulse 236 for activation timing control of the delayed keeper circuit 232. A slow NFET leakage current (i.e., below the predefined slow leakage indicator) and a fast PFET leakage current (i.e., above the predefined fast leakage indicator) is shown as indicating the "largest" pulse width setting of the pulse 236 for activation timing control of the delayed keeper circuit 232. FIG. 10 is a diagram 1000 of exemplary formulas for the Prog<0>-Prog<7> bits of the FET leakage control word 732 generated by the decoder circuit 730 for the comparator circuit 718 in FIG. 7, and as shown in the logic table 900 in FIG. 9.

Figure 11:
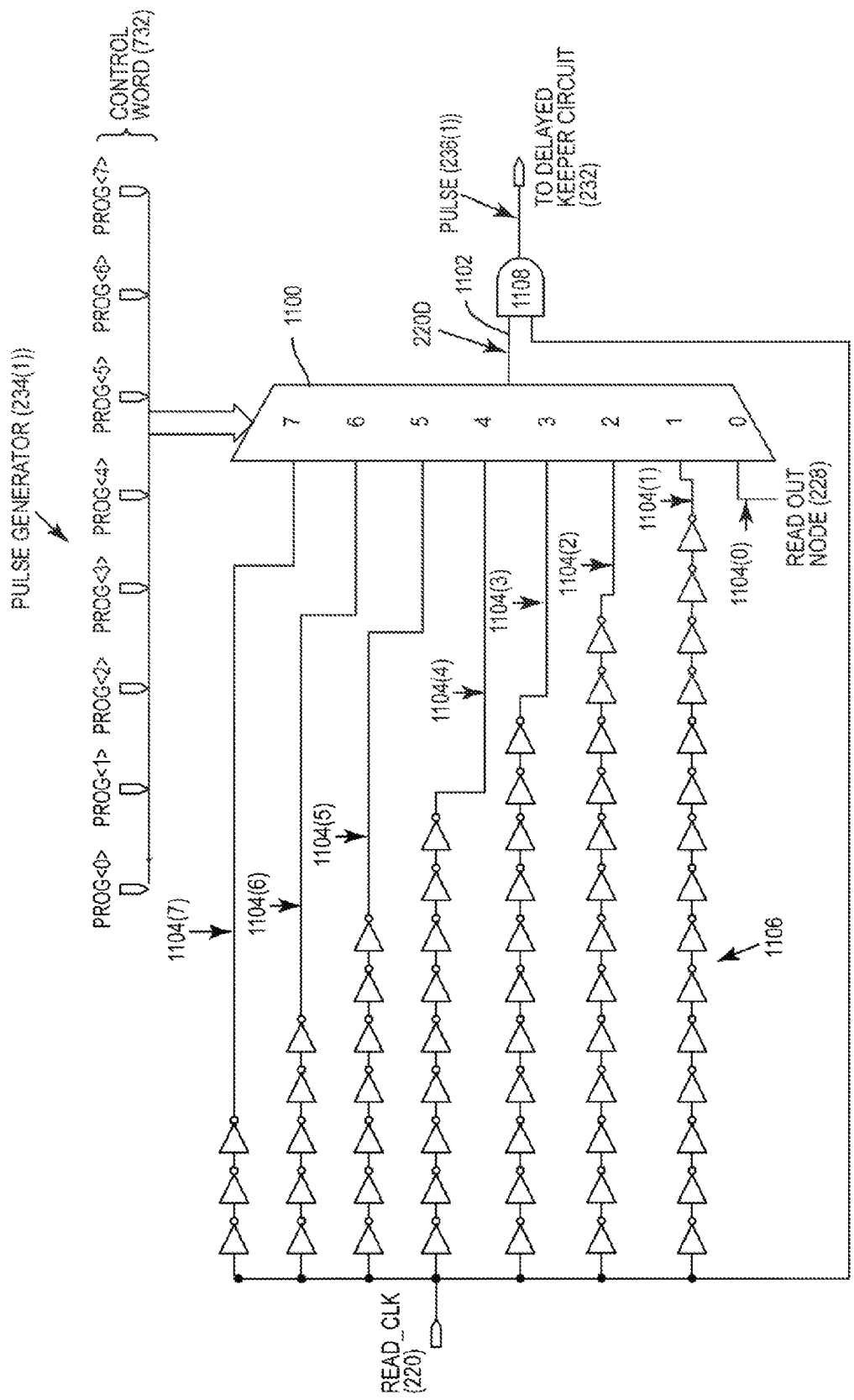
FIG. 11 is a circuit diagram of an exemplary pulse generator configured to receive a generated control signal from the leakage-aware activation control circuit in FIG. 7 to control activation timing of the delayed keeper circuit based on the comparison of the NFET leakage indicator and the PFET leakage indicator.

FIG. 11 is a circuit diagram of an exemplary pulse generator 234(1) that can be employed as the pulse generator 234 in FIG. 7 to receive the FET leakage control word 732 from the leakage-aware activation control circuit 700 to control activation timing of a delayed keeper circuit 232 based on the comparison of an NFET leakage indicator and a PFET leakage indicator. As shown in FIG. 11, the pulse generator 234(1) contains a multiplexor circuit 1100. The FET leakage control word 732 selects a signal path 1104 (0)-1104(7) provided by the multiplexor circuit 1100 to an output 1102 used by the pulse generator 234 to generate a pulse 236(1) to be provided to the delayed keeper circuit 232. Each signal path 1104(1)-1104(7) contains a different number of buffer circuits 1106 configured to delay the received read clock signal (read_clk) 220 based on the number of buffer circuits 1106 provided in the respective signal path 1104(0)-1104(7). Signal path 1104(0) is directly coupled to the read out node 228. A delayed read clock signal (read_clk) 220D according to the selected signal path 1104(0)-1104(7) by the FET leakage control word 732 is provided to an AND gate 1108 gated and ANDed with the undelayed read clock signal (read_clk) 220 to generate the pulse 236(1) to control the activation timing of the delayed keeper circuit 232.

Note that although the aspects herein are described with reference to a circuit that employs a pre-charge and then a discharge-evaluate mode, circuits that employ a pre-discharge and then a charge-evaluate are within the scope of the disclosure. For example, referring to the memory system 200 in FIG. 2 as an example, a skilled artisan would readily understand how to adapt the concepts herein to apply to such a circuit if the delayed keeper circuit 232 employed an NFET and the read port circuit 216(1) employed a PFET for the evaluation phase of the dynamic read circuit 214. In this example, the pulse generator 234 could be configured to generate an active low pulse out the output node 237 to control activation and deactivation of the delayed keeper circuit 232.

Leakage-aware activation control circuits disclosed herein to prevent or mitigate contention between the delayed keeper circuit and a read port circuit in the dynamic read circuit for performing a read operation in a memory bit cell according to aspects disclosed herein, may be provided in or integrated into a memory in any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 12:
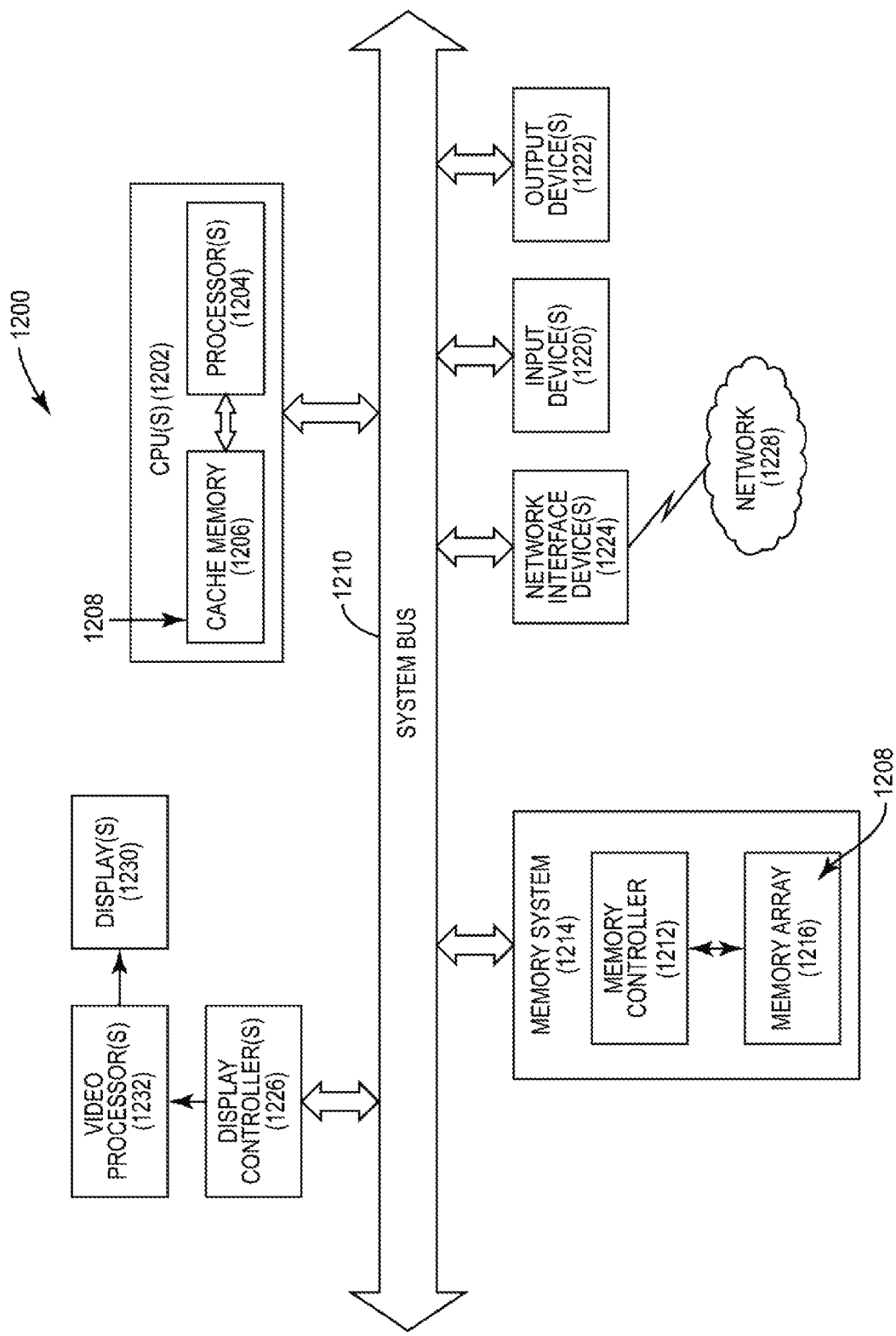
FIG. 12 is a block diagram of an exemplary processor-based system that can include a memory system that includes a dynamic read circuit employing a leakage-aware activation control circuit for controlling activation timing of a delayed keeper circuit in response to a read operation, and according to any of the aspects disclosed herein.

In this regard, FIG. 12 illustrates an example of a processor-based system 1200. Any component or circuit of the processor-based system 1200 can employ leakage-aware activation control circuits to prevent or mitigate contention between a delayed keeper circuit and a read port circuit in a dynamic read circuit for performing a read operation in a memory bit cell according to aspects disclosed herein. In this example, the processor-based system 1200 includes one or more central processing units (CPUs) 1202, each including one or more processors 1204. The CPU(s) 1202 may have cache memory 1206 coupled to the processor(s) 1204 for rapid access to temporarily stored data. As an example, the cache memory 1206 can employ any leakage-aware activation control circuit 1208 disclosed herein, including the leakage-aware activation control circuits 238 and 700 in FIGS. 2 and 7, respectively.

With continuing reference to FIG. 12, the CPU(s) 1202 is coupled to a system bus 1210 and can intercouple master and slave devices included in the processor-based system 1200. As is well known, the CPU(s) 1202 communicates with these other devices by exchanging address, control, and data information over the system bus 1210. For example, the CPU(s) 1202 can communicate bus transaction requests to a memory controller 1212 in a memory system 1214 as an example of a slave device. Although not illustrated in FIG. 12, multiple system buses 1210 could be provided, wherein each system bus 1210 constitutes a different fabric. In this example, the memory controller 1212 is configured to provide memory access requests to a memory array 1216 in the memory system 1214. As an example, the memory array 1216 can employ any of the leakage-aware activation control circuits 1208 disclosed herein, including the leakage-aware activation control circuits 238 and 700 in FIGS. 2 and 7, respectively.

Other devices can be connected to the system bus 1210. As illustrated in FIG. 12, these devices can include the memory system 1214, one or more input devices 1220, one or more output devices 1222, one or more network interface devices 1224, and one or more display controllers 1226, as examples. The input device(s) 1220 can include any type of input device, including but not limited to input keys, switches, voice processors, etc. The output device(s) 1222 can include any type of output device, including but not limited to audio, video, other visual indicators, etc. The network interface device(s) 1224 can be any devices configured to allow exchange of data to and from a network 1228. The network 1228 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1224 can be configured to support any type of communications protocol desired.

The CPU(s) 1202 may also be configured to access the display controller(s) 1226 over the system bus 1210 to control information sent to one or more displays 1230. The display controller(s) 1226 sends information to the display(s) 1230 to be displayed via one or more video processors 1232, which process the information to be displayed into a format suitable for the display(s) 1230. The display(s) 1230 can include any type of display, including but not limited to a cathode ray tube (CRT), a liquid crystal display (LCD), a plasma display, etc.

Note that the use of PFET and NFET in this disclosure can include PMOSFETs and NMOSFETs that are metal oxide semiconductors (MOSs). The PFETs and NFETs discussed herein can include other types of oxide layers other than metal.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A leakage-aware activation control circuit for controlling activation of a delayed keeper circuit in a dynamic read circuit for a memory bit cell, comprising:
   an N-type Field-Effect Transistor (NFET) leakage circuit configured to provide an NFET leakage indicator indicating leakage current of at least one NFET in the dynamic read circuit in response to a read operation of the dynamic read circuit;
   a P-type Field-Effect Transistor (PFET) leakage circuit configured to provide a PFET leakage indicator indicating leakage current of at least one PFET in the dynamic read circuit in response to the read operation of the dynamic read circuit;
   a comparator circuit configured to:
      receive the NFET leakage indicator and the PFET leakage indicator;
      compare the NFET leakage indicator to the PFET leakage indicator; and
      generate a FET leakage signal based on the comparison of the NFET leakage indicator to the PFET leakage indicator; and
   a control signal generator configured to adaptively generate at least one control signal based on the FET leakage signal to control activation timing of a delayed keeper circuit.

2. The leakage-aware activation control circuit of claim 1, wherein:
   the NFET leakage circuit comprises an NFET leakage sensor configured to determine NFET leakage;
   the NFET leakage sensor configured to provide the NFET leakage indicator indicating the leakage current of the at least one NFET based on the determined NFET leakage in the dynamic read circuit; and
   the PFET leakage circuit comprises a PFET leakage sensor configured to determine PFET leakage;
   the PFET leakage sensor configured to provide the PFET leakage indicator indicating the leakage current of the at least one PFET based on the determined PFET leakage in the dynamic read circuit.

3. The leakage-aware activation control circuit of claim 2, wherein:
   the NFET leakage sensor is comprised of at least one deactivated NFET configured to provide an NFET leakage current indicative of the leakage current of the at least one NFET; and
   the PFET leakage sensor is comprised of at least one deactivated PFET configured to provide a PFET leakage current indicative of the leakage current of the at least one PFET.

4. The leakage-aware activation control circuit of claim 3, wherein:
   the NFET leakage sensor is further comprised of an NFET ring oscillator circuit comprising a plurality of first buffer circuits coupled together in a ring oscillator, each of the plurality of first buffer circuits configured to be activated by the NFET leakage current indicative of the leakage current of the at least one NFET from the at least one deactivated NFET, the NFET ring oscillator circuit configured to update the NFET leakage indicator based on the provided NFET leakage current; and
   the PFET leakage sensor is further comprised of a PFET ring oscillator circuit comprising a plurality of second buffer circuits coupled together in a ring oscillator, each of the plurality of second buffer circuits configured to be activated by the PFET leakage current indicative of the leakage current of the at least one PFET from the at least one deactivated PFET, the PFET ring oscillator circuit configured to update the PFET leakage indicator based on the provided PFET leakage current.

5. The leakage-aware activation control circuit of claim 1, wherein:
   the NFET leakage circuit further comprises an NFET leakage frequency counter configured to store an NFET leakage frequency count;
   the NFET leakage circuit configured to control the NFET leakage frequency counter to update the NFET leakage frequency count as a function of the determined leakage current of the at least one NFET; and
   the PFET leakage circuit further comprises a PFET leakage frequency counter configured to store a PFET leakage frequency count;
   the PFET leakage circuit configured to control the PFET leakage frequency counter to update the PFET leakage frequency count as a function of the determined leakage current of the at least one PFET.

6. The leakage-aware activation control circuit of claim 1, wherein:
the comparator circuit is configured to generate the FET leakage signal comprising an FET leakage control signal based on the comparison of the NFET leakage indicator to the PFET leakage indicator; and
the control signal generator is configured to adaptively generate the at least one control signal based on the FET leakage control signal to control the activation timing of the delayed keeper circuit.

7. The leakage-aware activation control circuit of claim 6, wherein the comparator circuit comprises:
at least one PFET leakage comparator circuit configured to:
receive the NFET leakage indicator and the PFET leakage indicator;
compare the NFET leakage indicator to the PFET leakage indicator; and
control the FET leakage control signal to indicate whether the leakage current of the at least one PFET exceeds the leakage current of the at least one NFET, based on the comparison of the NFET leakage indicator to the PFET leakage indicator; and
at least one NFET leakage comparator circuit configured to:
receive the NFET leakage indicator and the PFET leakage indicator;
compare the NFET leakage indicator to the PFET leakage indicator; and
control the FET leakage control signal to indicate whether the leakage current of the at least one NFET exceeds the leakage current of the at least one PFET, based on the comparison of the NFET leakage indicator to the PFET leakage indicator.

8. The leakage-aware activation control circuit of claim 7, wherein the comparator circuit further comprises:
at least one PFET slow leakage comparator circuit configured to:
receive the PFET leakage indicator;
receive a predefined PFET slow leakage indicator indicative of a PFET slow leakage limit;
compare the predefined PFET leakage indicator to the predefined PFET slow leakage indicator; and
control the FET leakage control signal to indicate a PFET slow leakage current if the leakage current of the at least one PFET is less than the PFET slow leakage limit, based on the comparison of the PFET leakage indicator to the predefined PFET slow leakage indicator; and
at least one NFET slow leakage comparator circuit configured to:
receive the NFET leakage indicator;
receive a predefined NFET slow leakage indicator indicative of an NFET slow leakage limit;
compare the predefined NFET leakage indicator to the predefined NFET slow leakage indicator; and
control the FET leakage control signal to indicate an NFET slow leakage current if the leakage current of the at least one NFET is less than the NFET slow leakage limit, based on the comparison of the NFET leakage indicator to the predefined NFET slow leakage indicator.

9. The leakage-aware activation control circuit of claim 8, wherein the comparator circuit further comprises:

at least one PFET fast leakage comparator circuit configured to:
receive the PFET leakage indicator;
receive a predefined PFET fast leakage indicator indicative of a PFET fast leakage limit;
compare the PFET leakage indicator to the predefined PFET fast leakage indicator; and
control the FET leakage control signal to indicate a PFET fast leakage current if the leakage current of the at least one PFET is greater than the PFET fast leakage limit, based on the comparison of the PFET leakage indicator to the predefined PFET fast leakage indicator; and
at least one NFET fast leakage comparator circuit configured to:
receive the NFET leakage indicator;
receive a predefined NFET fast leakage indicator indicative of an NFET fast leakage limit;
compare the NFET leakage indicator to the predefined NFET fast leakage indicator; and
control the FET leakage control signal to indicate an NFET fast leakage current if the leakage current of the at least one NFET is greater than the NFET fast leakage limit, based on the comparison of the NFET leakage indicator to the predefined NFET fast leakage indicator.

10. The leakage-aware activation control circuit of claim 9, wherein the comparator circuit further comprises:
at least one PFET nominal leakage comparator circuit configured to:
receive the PFET leakage indicator;
receive a predefined PFET nominal leakage indicator indicative of a PFET nominal leakage limit;
compare the PFET leakage indicator to the predefined PFET nominal leakage indicator; and
control the FET leakage control signal to indicate a PFET nominal leakage current if the leakage current of the at least one PFET is greater than the PFET nominal leakage limit, based on the comparison of the PFET leakage indicator to the predefined PFET nominal leakage indicator; and
at least one NFET nominal leakage comparator circuit configured to:
receive the NFET leakage indicator;
receive a predefined NFET nominal leakage indicator indicative of an NFET nominal leakage limit;
compare the NFET leakage indicator to the predefined NFET nominal leakage indicator; and
control the FET leakage control signal to indicate an NFET nominal leakage current if the leakage current of the at least one NFET is greater than the NFET nominal leakage limit, based on the comparison of the NFET leakage indicator to the predefined NFET nominal leakage indicator.

11. The leakage-aware activation control circuit of claim 6, wherein the control signal generator comprises a decoder circuit configured to decode the FET leakage control signal into a FET leakage control word to control the activation timing of the delayed keeper circuit.

12. The leakage-aware activation control circuit of claim 7, wherein the comparator circuit further comprises:
at least one PFET fast leakage comparator circuit configured to:
receive the PFET leakage indicator;
receive a predefined PFET fast leakage indicator indicative of a PFET fast leakage limit;

compare the PFET leakage indicator to the predefined PFET fast leakage indicator; and control the FET leakage control signal to indicate a PFET fast leakage current if the leakage current of the at least one PFET is greater than the PFET fast leakage limit, based on the comparison of the PFET leakage indicator to the predefined PFET fast leakage indicator; and at least one NFET fast leakage comparator circuit configured to:

receive the NFET leakage indicator;

receive a predefined NFET fast leakage indicator indicative of an NFET fast leakage limit;

compare the NFET leakage indicator to the predefined NFET fast leakage indicator; and control the FET leakage control signal to indicate an NFET fast leakage current if the leakage current of the at least one NFET is greater than the NFET fast leakage limit, based on the comparison of the NFET leakage indicator to the predefined NFET fast leakage indicator.

13. The leakage-aware activation control circuit of claim 7, wherein the comparator circuit further comprises:

at least one PFET nominal leakage comparator circuit configured to:

receive the PFET leakage indicator;

receive a predefined PFET nominal leakage indicator indicative of a PFET nominal leakage limit;

compare the PFET leakage indicator to the predefined PFET nominal leakage indicator; and control the FET leakage control signal to indicate a PFET nominal leakage current if the leakage current of the at least one PFET is greater than the PFET nominal leakage limit, based on the comparison of the PFET leakage indicator to the predefined PFET nominal leakage indicator; and at least one NFET nominal leakage comparator circuit configured to:

receive the NFET leakage indicator;

receive a predefined NFET nominal leakage indicator indicative of an NFET nominal leakage limit;

compare the NFET leakage indicator to the predefined NFET nominal leakage indicator; and control the FET leakage control signal to indicate an NFET nominal leakage current if the leakage current of the at least one NFET is greater than the NFET nominal leakage limit, based on the comparison of the NFET leakage indicator to the predefined NFET nominal leakage indicator.

14. The leakage-aware activation control circuit of claim 1, wherein the control signal generator is configured to adaptively generate the at least one control signal based on controlling timing of a pulse width of a pulse generated by a pulse generator configured to control the activation timing of the delayed keeper circuit, based on the comparison of the NFET leakage indicator to the PFET leakage indicator.

15. The leakage-aware activation control circuit of claim 1 integrated into a system-on-a-chip (SoC).

16. The leakage-aware activation control circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

17. A leakage-aware activation control circuit for controlling activation of a delayed keeper circuit in a dynamic read circuit for a memory bit cell, comprising:

means for providing an N-type Field-Effect Transistor (NFET) leakage indicator indicating leakage current of at least one NFET in a dynamic read circuit;

means for providing a P-type FET (PFET) leakage indicator indicating leakage current of at least one PFET in the dynamic read circuit;

means for receiving the NFET leakage indicator and the PFET leakage indicator;

means for comparing the NFET leakage indicator to the PFET leakage indicator;

means for generating a FET leakage signal based on the comparison of the NFET leakage indicator to the PFET leakage indicator; and means for adaptively generating at least one control signal based on the FET leakage signal to control activation timing of a delayed keeper circuit.

18. A leakage-aware activation control circuit for controlling activation of a delayed keeper circuit in a dynamic read circuit for a memory bit cell, comprising:

an N-type Field-Effect Transistor (NFET) leakage sensor configured to determine NFET leakage of at least one NFET in the dynamic read circuit and provide an NFET leakage indicator indicating an NFET leakage current;

an P-type Field-Effect Transistor (PFET) leakage sensor configured to determine PFET leakage of at least one PFET in the dynamic read circuit and provide a PFET leakage indicator indicating a PFET leakage current;

a comparator circuit configured to:

receive the NFET leakage indicator and the PFET leakage indicator;

compare the NFET leakage indicator to the PFET leakage indicator; and generate a FET leakage signal based on the comparison of the NFET leakage indicator to the PFET leakage indicator; and a control signal generator configured to adaptively generate at least one control signal based on the FET leakage signal to control activation timing of the delayed keeper circuit.

19. The leakage-aware activation control circuit of claim 18, wherein:

the NFET leakage sensor is comprised of at least one deactivated NFET configured to provide the NFET leakage current indicative of the NFET leakage of the at least one NFET; and the PFET leakage sensor is comprised of at least one deactivated PFET configured to provide the PFET leakage current indicative of the PFET leakage of the at least one PFET.

20. The leakage-aware activation control circuit of claim 19, wherein:

the NFET leakage sensor is further comprised of an NFET ring oscillator circuit comprising a plurality of first buffer circuits coupled together in a ring oscillator, each of the plurality of first buffer circuits configured to be activated by the NFET leakage current indicative of the NFET leakage of the at least one NFET from the at least one deactivated NFET, the NFET ring oscillator circuit configured to update the NFET leakage indicator based on the provided NFET leakage current; and the PFET leakage sensor is further comprised of a PFET ring oscillator circuit comprising a plurality of second buffer circuits coupled together in a ring oscillator, each of the plurality of second buffer circuits configured to be activated by the PFET leakage current indicative of the PFET leakage of the at least one PFET from the at least one deactivated PFET, the PFET ring oscillator circuit configured to update the PFET leakage indicator based on the provided PFET leakage current.

21. The leakage-aware activation control circuit of claim 18, wherein:
the comparator circuit is configured to generate the FET leakage signal comprising an FET leakage control signal based on the comparison of the NFET leakage indicator to the PFET leakage indicator; and
the control signal generator is configured to adaptively generate the at least one control signal comprising the FET leakage control signal based on the FET leakage control signal to control the activation timing of the delayed keeper circuit.

22. The leakage-aware activation control circuit of claim 21, wherein the control signal generator comprises a decoder circuit configured to decode the FET leakage control signal into a FET leakage control word to control the activation timing of the delayed keeper circuit.

23. The leakage-aware activation control circuit of claim 18, wherein the control signal generator is configured to adaptively generate the at least one control signal based on controlling timing of a pulse width of a pulse generated by a pulse generator configured to control the activation timing of the delayed keeper circuit, based on the comparison of the NFET leakage indicator to the PFET leakage indicator.

24. A leakage-aware activation control circuit for controlling activation of a delayed keeper circuit in a dynamic read circuit for a memory bit cell, comprising:
an N-type Field-Effect Transistor (NFET) leakage circuit comprising an NFET leakage frequency counter configured to store an NFET leakage frequency count;
the NFET leakage circuit configured to determine NFET leakage of at least one NFET in the dynamic read circuit and control the NFET leakage frequency counter to update the NFET leakage frequency count as a function of the determined NFET leakage of the at least one NFET;
a P-type Field-Effect Transistor (PFET) leakage circuit comprising a PFET leakage frequency counter configured to store a PFET leakage frequency count;
the PFET leakage circuit configured to determine PFET leakage of at least one PFET in the dynamic read circuit and control the PFET leakage frequency counter to update the PFET leakage frequency count as a function of the determined PFET leakage of the at least one PFET;
a comparator circuit configured to:
receive the NFET leakage frequency count and the PFET leakage frequency count;
compare the NFET leakage frequency count to the PFET leakage frequency count; and
generate a FET leakage signal based on the comparison of the NFET leakage frequency count to the PFET leakage frequency count; and
a control signal generator configured to adaptively generate at least one control signal based on a FET leakage signal to control activation timing of the delayed keeper circuit.

25. The leakage-aware activation control circuit of claim 24, wherein:
the comparator circuit is configured to generate the FET leakage signal comprising an FET leakage control signal based on the comparison of an NFET leakage indicator to a PFET leakage indicator; and
the control signal generator is configured to adaptively generate the at least one control signal comprising the FET leakage control signal based on the FET leakage signal to control the activation timing of the delayed keeper circuit.

26. The leakage-aware activation control circuit of claim 25, wherein the control signal generator comprises a decoder circuit configured to decode the FET leakage control signal into a FET leakage control word to control the activation timing of the delayed keeper circuit.

27. The leakage-aware activation control circuit of claim 24, wherein the control signal generator is configured to adaptively generate the at least one control signal based on controlling timing of a pulse width of a pulse generated by a pulse generator configured to control the activation timing of the delayed keeper circuit, based on the comparison of an NFET leakage indicator to a PFET leakage indicator.

* * * * *